(12) United States Patent
Kim et al.

(10) Patent No.: US 7,813,180 B2
(45) Date of Patent: Oct. 12, 2010

(54) NON-VOLATILE MEMORY DEVICES AND METHODS OF OPERATING THE SAME

(75) Inventors: Won-joo Kim, Hwaseong-si (KR); Yoon-dong Park, Yongin-si (KR); June-mo Koo, Seoul (KR); Suk-pil Kim, Yongin-si (KR); Tae-hee Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 279 days.

(21) Appl. No.: 12/005,376

(22) Filed: Dec. 27, 2007

(65) Prior Publication Data

US 2008/0175061 A1    Jul. 24, 2008

(30) Foreign Application Priority Data

Jan. 24, 2007   (KR) .................. 10-2007-0007641

(51) Int. Cl.
*G11C 7/00* (2006.01)
(52) U.S. Cl. ..................... 365/185.18; 365/185.26; 257/315; 257/319; 257/314
(58) Field of Classification Search ............ 365/185.18, 365/185.26; 257/315, 319, 314
See application file for complete search history.

(56) References Cited

U.S. PATENT DOCUMENTS

| | | | | |
|---|---|---|---|---|
| 6,936,887 | B2 * | 8/2005 | Harari et al. | 257/319 |
| 7,196,370 | B2 * | 3/2007 | Kai et al. | 257/315 |
| 7,491,998 | B2 * | 2/2009 | Chang et al. | 257/314 |
| 7,579,247 | B2 * | 8/2009 | Harari et al. | 438/287 |

* cited by examiner

*Primary Examiner*—Connie C Yoha
(74) *Attorney, Agent, or Firm*—Harness, Dickey & Pierce, P.L.C.

(57) ABSTRACT

Example embodiment non-volatile memory devices may be capable of increased integration and reliability and may provide example methods of operating non-volatile memory devices. Example embodiment non-volatile memory devices may include a first control gate electrode on a semiconductor substrate. A first charge storing layer may be between the semiconductor substrate and the first control gate electrode. A source region may be defined in the semiconductor substrate at one side of the first control gate electrode. A first auxiliary gate electrode may be at the other side of the first control gate electrode and may be recessed into the semiconductor substrate. A first drain region may be defined in the semiconductor substrate at one side of the first auxiliary gate electrode opposite to the first control gate electrode. A bit line may be connected to the first drain region.

22 Claims, 7 Drawing Sheets
(1 of 7 Drawing Sheet(s) Filed in Color)

NON-VOLATILE MEMORY DEVICES AND METHODS OF OPERATING THE SAME

PRIORITY STATEMENT

This application claims benefit under 35 U.S.C. §119(e) to Korean Patent Application No. 10-2007-0007641, filed on Jan. 24, 2007, in the Korean Intellectual Property Office, the entire disclosure of which is incorporated herein by reference.

BACKGROUND

1. Field

Example embodiments may relate to semiconductor devices, for example, to non-volatile memory devices and/or methods of operating the same.

2. Description of the Related Art

Non-volatile memory devices, for example, flash memories, may be classified into NAND and NOR types. NAND and NOR type flash memory devices may have faster erase characteristics that utilize block erase characteristics. NAND and NOR type flash memory devices may have differing programming and/or reading methods and may have differing degrees of integration. Due to these differences, NAND and NOR type flash memory devices may not be used in similar applications.

Because random access may be easier in a NOR type flash memory device, NOR type flash memory devices may have faster read speeds and may more easily enable programs to be selectively stored therein. Because a channel hot electron injection (CHEI) method may be used in NOR type flash memory devices, operation voltage may be higher. It may be more difficult to reduce channel length to prevent or reduce punch-through due to higher operation voltage.

Further, NOR type flash memory devices may discharge electric charge in a previously-programmed cell through a bit line in a read operation. This discharging may be referred to as drain disturbance. NOR type flash memory devices may have an off-cell that may not be read in a read operation if an over-erased cell exists.

SUMMARY

The applicants having recognized deficiencies of prior art memory devices, example embodiments may provide non-volatile memory devices free from the above-discussed disadvantages of related art NOR type flash memory devices.

Example embodiments may also provide methods of operating non-volatile memory devices.

Example embodiments may provide non-volatile memory devices including a first control gate electrode on a semiconductor substrate, a first charge storing layer between the semiconductor substrate and the first control gate electrode, a source region defined in the semiconductor substrate at a first side of the first control gate electrode, a first auxiliary gate electrode at a second side of the first control gate electrode and recessed into the semiconductor substrate, a first drain region defined in the semiconductor substrate at a first side of the first auxiliary gate electrode opposite to the first control gate electrode, and/or a bit line connected to the first drain region.

A bottom surface of the first charge storing layer may be higher than a top surface of the first auxiliary gate electrode. Example embodiment non-volatile memory devices may further include a first channel region near a surface of the semiconductor substrate below the first control gate electrode and/or a second channel region near a surface of the semiconductor substrate surrounding the first auxiliary gate electrode. The first and second channel regions are may be connected to each other.

Example embodiments may provide non-volatile memory devices including a cell array in which a plurality of unit cells having memory and/or auxiliary transistors connected in series may be arrayed in a matrix, a plurality of bit lines arranged in different rows in the cell array, and/or a plurality of word lines arranged in different columns in the cell array. The memory transistor may include a control gate electrode on a semiconductor substrate, a charge storing layer between the semiconductor substrate and the control gate electrode, and/or a source region in the semiconductor substrate at one side of the control gate electrode. The auxiliary transistor may includes an auxiliary gate electrode at one side of the control gate electrode and recessed into the semiconductor substrate and/or a drain region defined in the semiconductor substrate at one side of the auxiliary gate electrode opposite to the control gate electrode. Each of the plurality of bit lines may be connected to drain regions of memory transistors in unit cells arranged in the same row, and each of the plurality of word lines may be connected to control gate electrodes in unit cells arranged in the same column.

The source region in a pair of unit cells may be shared. The pair of unit cells may be defined between two adjacent bit lines of the plurality of bit lines and may be arranged in the same row. Example embodiment non-volatile memory devices may further include a plurality of source lines arranged in different columns in the cell array such that source regions arranged in the same column may be connected to one another.

Example methods may include methods of operating non-volatile memory devices including performing a program operation of selecting one or more of a plurality of unit cells to store data into unit cells. Auxiliary transistors in other unit cells except selected unit cells may be turned off in the program operation.

Example methods may further include a read operation of selecting one or more of the plurality of unit cells to read data states of unit cells. Auxiliary transistors in other unit cells except selected unit cells may be turned off in the read operation.

BRIEF DESCRIPTION OF THE DRAWINGS

The patent or application file contains at least one drawing executed in color. Copies of this patent or patent application publication with color drawing will be provided by the Office upon request and payment of the necessary fee.

The above and other features and/or advantages of example embodiments will become more apparent by describing in detail the attached drawings in which.

DETAILED DESCRIPTION

Figure 1:
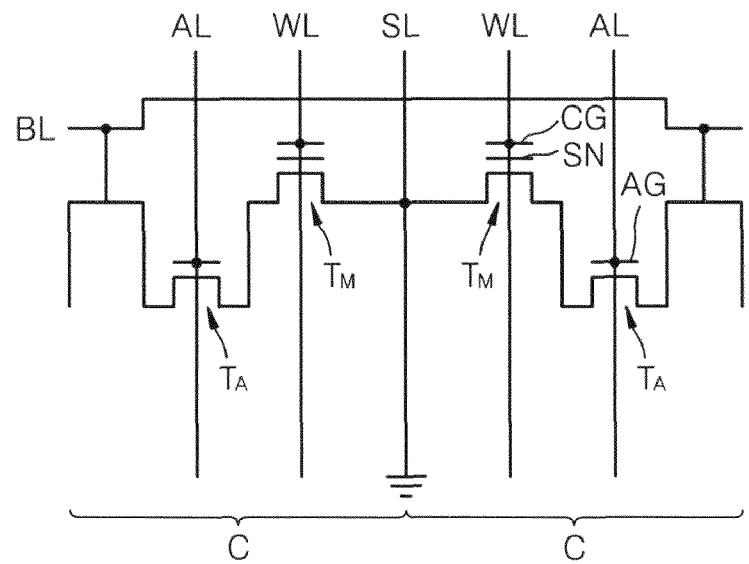
FIG. 1 is a circuit diagram of an example embodiment non-volatile memory device.

Example embodiments will now be described more fully hereinafter with reference to the accompanying drawings. Example embodiments may, however, be embodied in many different forms and should not be construed as being limited to the example embodiments set forth herein. Rather, these example embodiments are provided so that this disclosure will be thorough, and will fully convey the scope to one skilled in the art. In the drawings, the thicknesses of layers and regions are exaggerated for clarity. Like numbers refer to like elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of the example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiment non-volatile memory devices may include an EEPROM and/or flash memory devices. However, the claims are not limited to such designations in example embodiments.

FIG. 1 is a circuit diagram of an example embodiment non-volatile memory device.

As shown in FIG. 1, an example embodiment non-volatile memory device may include a pair of unit cells C connected in series. Each unit cell C may include a memory transistor $T_M$ and/or an auxiliary transistor $T_A$, which may be connected in series. Unit cells C may be symmetrically arranged and include substantially similar structures.

Each of the pair of memory transistors $T_M$ may include a storage node SN and/or a control gate CG. Storage node SN may be used to store electric charge, and control gate CG may be used to control operation of memory transistors $T_M$. Each of the pair of auxiliary transistors $T_A$ may include an auxiliary gate AG for turning auxiliary transistors on or off. The auxiliary transistors $T_A$ may include, for example, MOS field effect transistors or another suitable transistor.

A pair of word lines WL may be each connected to a control gate CG of the memory transistors $T_M$. A pair of auxiliary lines AL may be each connected to an auxiliary gate AG of the auxiliary transistors $T_A$. A bit line BL may be connected to ends of the auxiliary transistors $T_A$. Ends of the memory transistors $T_M$ may share a source line SL. The source line SL may be grounded and between the memory transistors $T_M$ so as to be shared by the pair of unit cells C.

In an example embodiment, the pair of unit cells C may be a minimally repetitive structure in which the source line SL may be shared by the pair of unit cells C. Alternatively, the pair of unit cells C may be referred to as a single cell.

Figure 2:
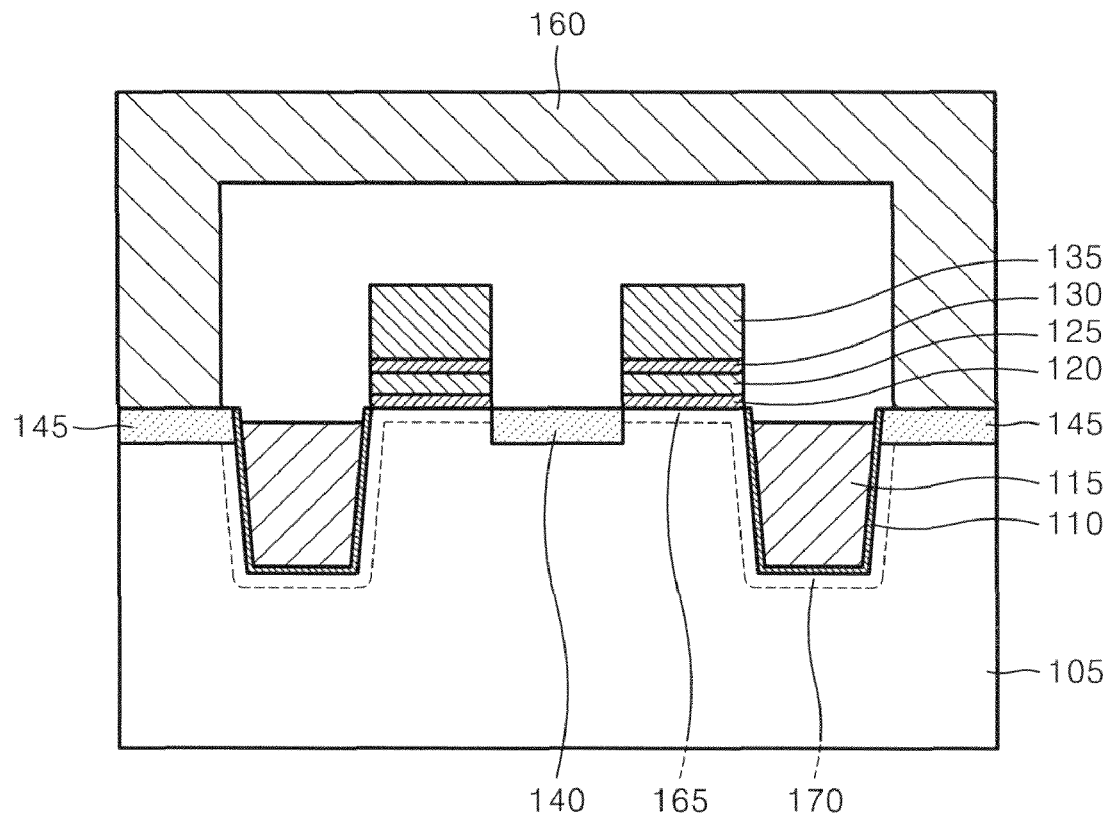
FIG. 2 is a cross-sectional view of an example embodiment non-volatile memory device.

FIG. 2 is a cross-sectional view of an example embodiment non-volatile memory device. The example embodiment in FIG. 2 may correspond to the circuit diagram of the two unit cells C of FIG. 1.

As shown in FIG. 2, a pair of control gate electrodes 135 (first and second control gate electrodes) may be formed on a semiconductor substrate 105. A source region 140 may be defined in the semiconductor substrate 105 between the control gate electrodes 135. A pair of auxiliary gate electrodes 115 (first and second auxiliary gate electrodes) may be recessed into the semiconductor substrate 105 at sides of the control gate electrodes 135 such that the pair of control gate electrodes 135 may be between the pair of auxiliary gate electrodes 115. A pair of drain regions 145 (first and second drain regions) may be defined in the semiconductor substrate 105 at sides of the auxiliary gate electrodes 115 such that the pair of auxiliary gate electrodes 115 may be between the pair of drain regions 145.

The semiconductor substrate 105 may include, for example, Si, Ge, Si/Ge, and/or another suitable semiconductor material. The semiconductor substrate 105 may have a bulk wafer structure and may further include an epitaxial layer on such a bulk wafer.

The source and drain regions 140 and 145 may be formed by implanting impurities onto the semiconductor substrate 105. For example, if the semiconductor substrate 105 has a first conductive type, the source and drain regions 140 and 145 may be doped with impurities having a second conductive type that may be opposite to the first conductive type. For example, the first and second conductive types may be n-type and p-type, or p-type and n-type, respectively.

A pair of charge storing layers 125 (first and second charge storing layers) may be between the semiconductor substrate 105 and the control gate electrodes 135. Each of the charge storing layers 125 may correspond to the storage node SN of FIG. 1. A pair of tunneling insulating layers 120 (first and second tunneling insulating layers) may each be between the semiconductor substrate 105 and the charge storing layers 125. A pair of blocking insulating layers 130 (first and second blocking insulating layers) may be each between the control gate electrodes 135 and the charge storing layers 125. A pair of gate insulating layers 110 (first and second gate insulating layers) may each be between the semiconductor substrate 105 and the auxiliary gate electrodes 115.

Each of the gate insulating layers 110, the tunneling insulating layers 120, and the blocking insulating layers 130 may respectively include, for example, an oxide layer, a nitride layer, and a high dielectric constant layer. The high dielectric constant layer may be an insulating layer having a dielectric constant larger than the oxide and nitride layers. Each of the charge storing layers 125 may include a poly-silicon, nitride layer, dot, and/or nanocrystal. The dot and/or nanocrystal may refer be, for example, fine structures of metal and/or silicon.

The control gate electrodes 135, the charge storing layers 125, and/or the source region 140 may form the memory transistors $T_M$ shown in FIG. 1. In this case, the source region 140 may be shared by the memory transistors $T_M$. The auxiliary gate electrodes 115 and/or the drain regions 145 may form the auxiliary transistors $T_A$ shown in FIG. 1. Each of the memory transistors $T_M$ may have a planar-type structure, and each of the auxiliary transistors $T_A$ may be recessed structure.

The control and auxiliary gate electrodes 135 and 115 may have different heights. A bottom surface of each of the charge storing layer 125 may be higher than a top surface of the auxiliary gate electrode 115. Accordingly, the control and auxiliary gate electrodes 135 and 115 may be adjacent in one dimension without contacting each other. That is, the control and auxiliary gate electrodes 135 and 115 may be close or "overlapping" horizontally, and spaced apart from each other in a vertical direction.

First channel regions 165 may be defined near a surface of the semiconductor substrate 105 below the control gate electrodes 135. Second channel regions 170 may be defined near a surface of the semiconductor substrate 105 surrounding the auxiliary gate electrodes 115. The first and second channel regions 165 and 170 may be inversion regions if the memory and auxiliary transistors $T_M$ and $T_A$ are turned on. The first and second channel regions 165 and 170 may be conductive paths.

Because the control and auxiliary gate electrodes 135 and 115 may be close in a horizontal direction, the first and second regions 165 and 170 may be conductively connected to each other. Thus, a source or drain region (not shown) may not be needed between the control and auxiliary gate electrodes 135 and 115. Integration of example embodiment non-volatile memory device may thus be increased. In example embodiments, electric charges may flow into the drain region 145 from the source region 140 through the first and second channel regions 165 and 170.

In another example embodiment, an additional source or drain region (not shown) may be between the control and auxiliary gate electrodes 135 and 115.

The source region 140 may be used as the source line SL (FIG. 1). The source line SL may extend below an isolation layer (not shown) from the source region 140. A bit line 160 may be connected to the drain regions 145. For example, the bit line 160 may include a contact plug and/or a metal line. Alternatively, the source line SL may be a metal line on the semiconductor substrate 105 electrically connected to the source region 140.

Figure 3:
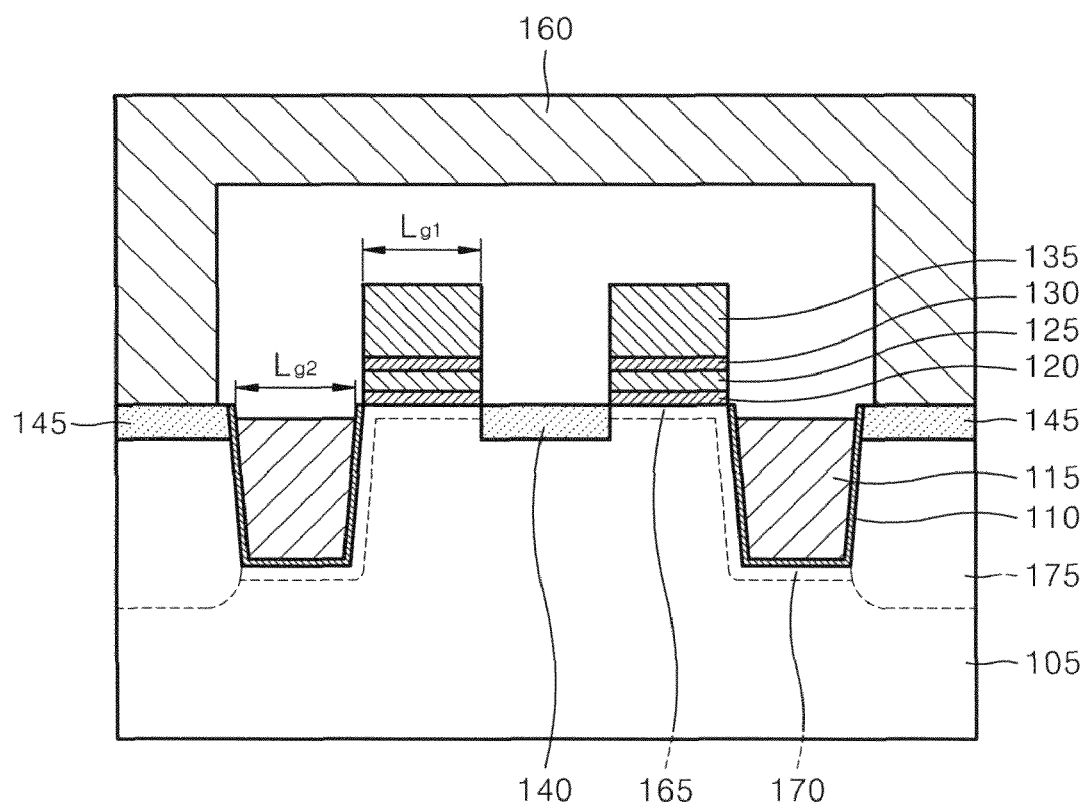
FIG. 3 is a cross-sectional view showing an operational characteristic of the example embodiment non-volatile memory device of FIG. 2.

FIG. 3 is a cross-sectional view showing an operational characteristic of the example embodiment non-volatile memory device of FIG. 2.

As shown in FIG. 3, a turn-on voltage, for example, about 3V to about 9V, may be applied to each of the control and auxiliary gate electrodes 135 and 115. An operating voltage, for example, about 5V, may be applied to the bit line 160. The source region 140 may be grounded. Depletion regions 175 may be defined in the semiconductor substrate 105 around the drain regions 145.

The first channel regions 165 may be separated from the depletion regions 175, and punch-through of the memory transistors $T_M$ may be reduced or prevented. In this way, gate length $L_{g1}$ of the control gate electrodes 135 may be reduced. The recess-type auxiliary transistors $T_A$ may be less influenced by punch-through due to the long second channel regions 170. Thus, gate length $L_{g2}$ of each of the auxiliary gate electrodes 115 may be reduced, and example embodiment non-volatile memory devices may have increased integration.

Figure 4:
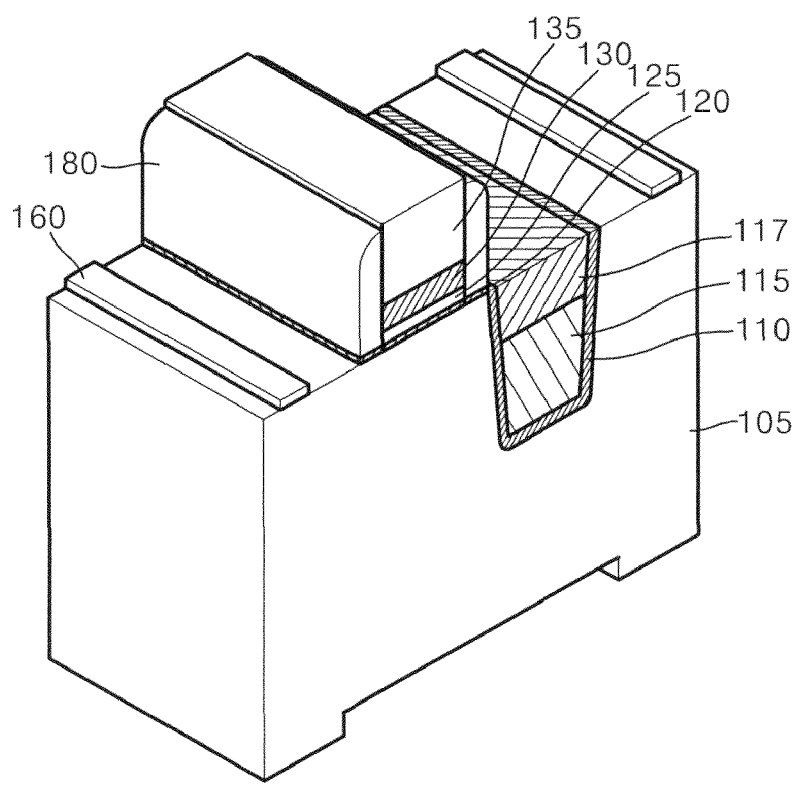
FIG. 4 is a perspective view of an example embodiment non-volatile memory device.
Figure 5:
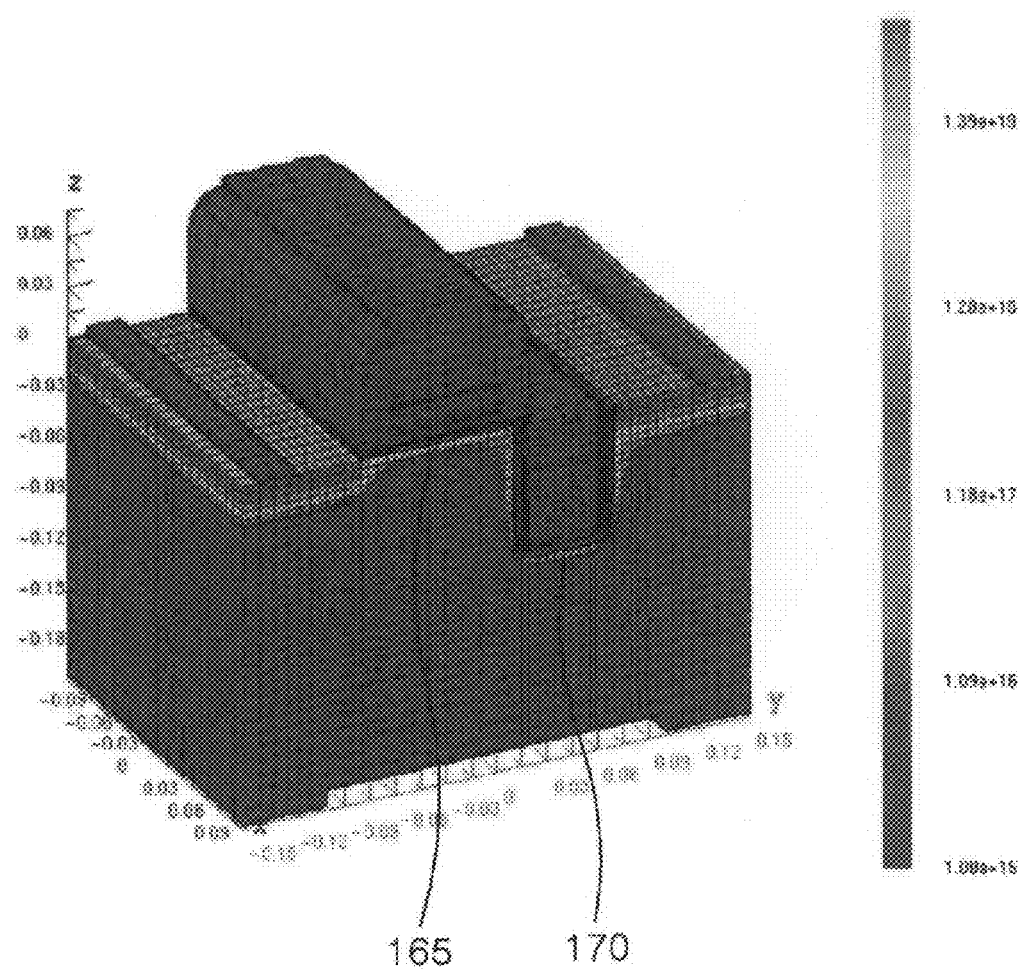
FIG. 5 is a perspective view showing an electron density distribution through a simulation for the example embodiment non-volatile memory device of FIG. 4.

FIG. 4 is a perspective view of an example embodiment non-volatile memory device, and FIG. 5 is a perspective view showing electron density during a simulation involving the example embodiment non-volatile memory device of FIG. 4. FIG. 4 may refer to the right unit cell C of the example embodiment non-volatile memory device of FIG. 2, although the following description may describe other unit cells of example embodiments as well.

As shown in FIG. 4, spacer insulating layers may be formed on either sidewall of a control gate electrode 135. An auxiliary gate electrode 115 may be recessed into a semiconductor substrate 105, and/or a capping insulating layer 117 may be formed on the auxiliary gate electrode 115. A bit line 160 may be connected to a drain region (as 145 of FIG. 2). A silicon wafer may be used as the semiconductor substrate 105. A turn-on voltage, for example, about 4V, may be applied to the control and auxiliary gate electrode 135 and 115. An operating voltage, for example, about 4V, may be applied to the bit line 160.

Electron density distribution of the non-volatile memory device is illustrated in FIG. 5. Memory and auxiliary transistors TM and TA may be turned on, and electron densities of first and second channel regions 165 and 170 may be increased. The first and second channel regions 165 and 170 may be connected to each other with no source or drain region therebetween.

Figure 6:
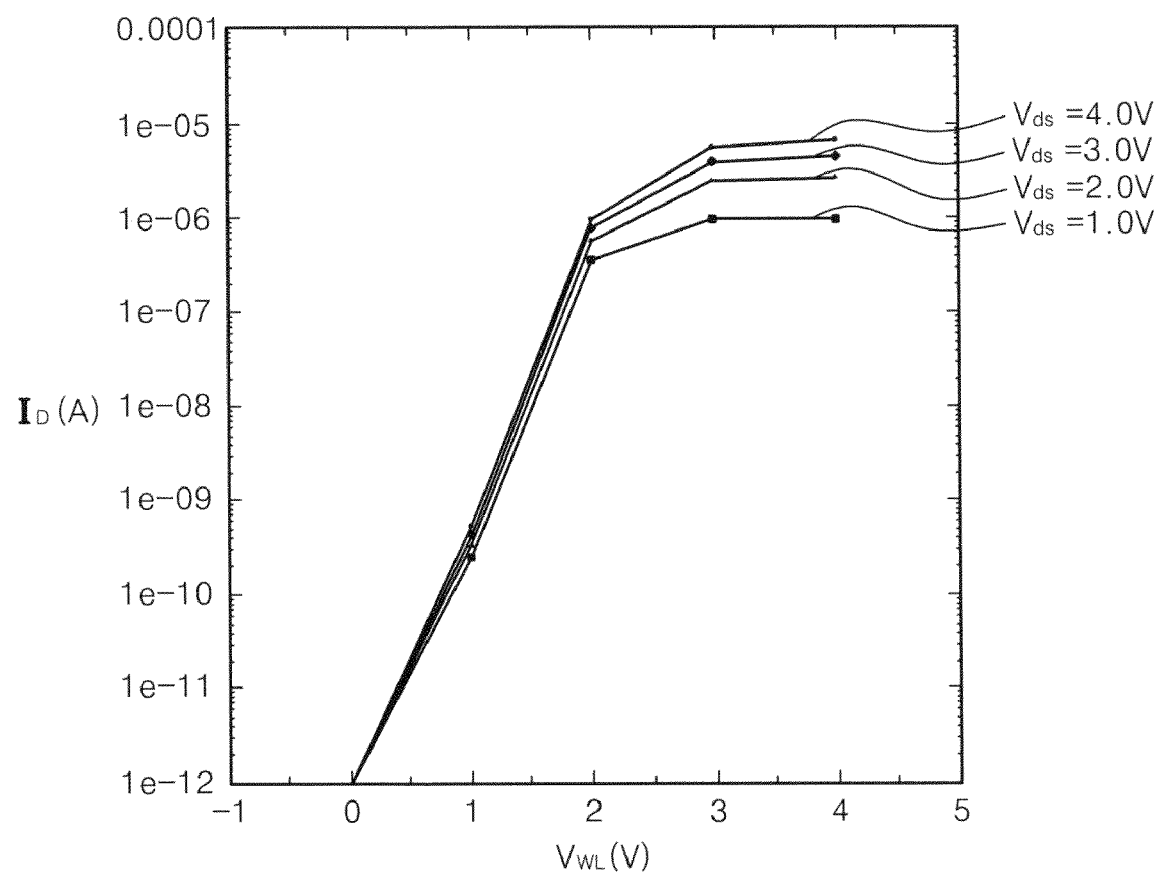
FIG. 6 is a graph illustrating a voltage-current characteristic for the example embodiment non-volatile memory device of FIG. 4.

FIG. 6 is a graph illustrating a voltage-current characteristic for the example embodiment non-volatile memory device of FIG. 4.

As shown in FIG. 6, a change in current $I_D$ flowing from a drain region to a source region with respect to a voltage $V_{WL}$ applied to the control gate electrode 135 was measured by varying a voltage $V_{ds}$ applied to the bit line 160. The voltage applied to the bit line 160 may be substantially varied, but a leakage current, $I_D$ when $V_{WL}$ is near 0, may vary little. Such a result may show that a leakage current due to punch-through is reduced in example embodiment non-volatile memory devices.

Figure 7:
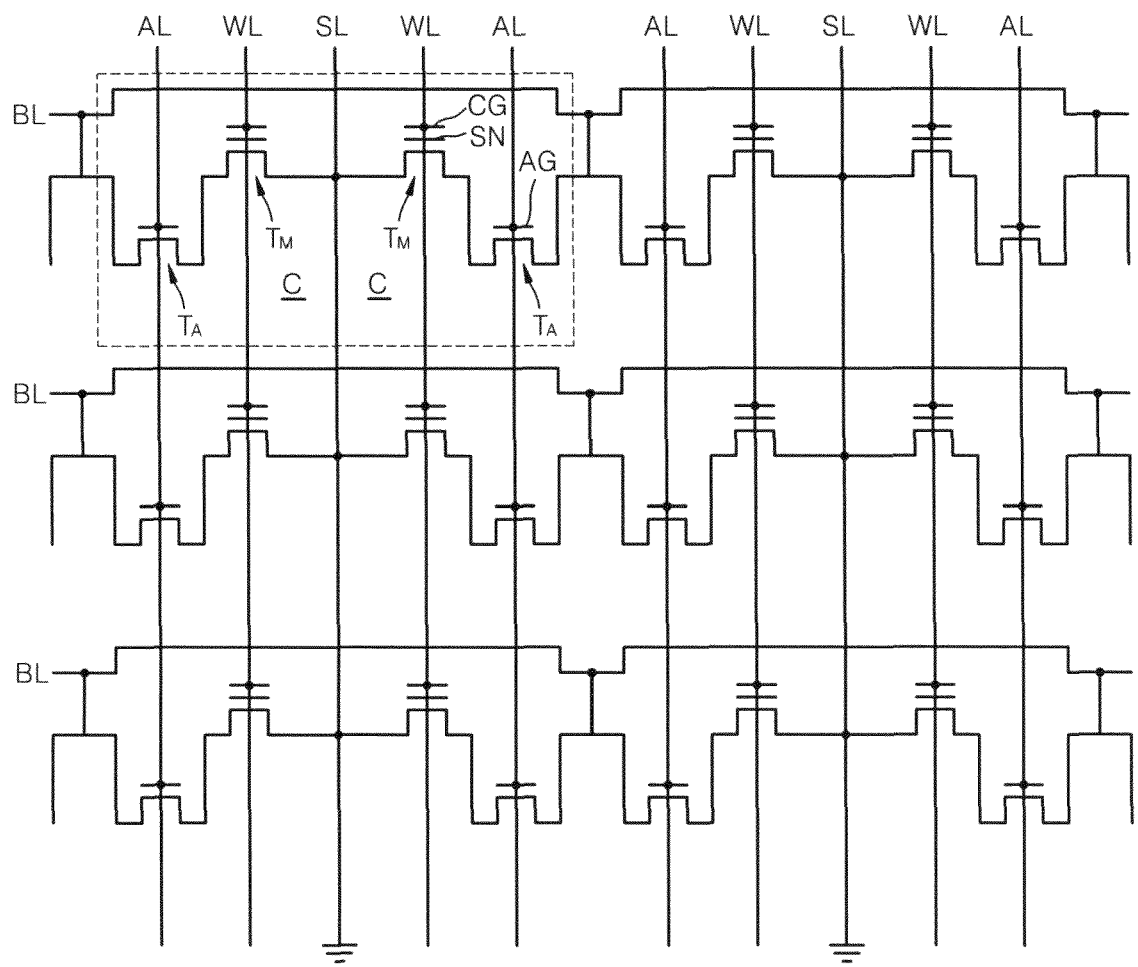
FIG. 7 is a circuit diagram of an example embodiment non-volatile memory device.

FIG. 7 is a circuit diagram of an example embodiment non-volatile memory device. The example embodiment non-volatile memory device in FIG. 7 may correspond to a NOR array of the example embodiment non-volatile memory devices of FIG. 1. Redundant descriptions between the two example embodiments may be omitted. A structure of the example embodiment non-volatile memory device in FIG. 7 will be described with reference to FIG. 2.

As shown in FIG. 7, a plurality of unit cells C arrayed in a matrix may make up a cell array. Each of the unit cells C may be structured similarly to example embodiments in FIGS. 1 and 2. A plurality of bit lines BL may be arranged in different rows in the cell array. A plurality of word lines WL may be arranged in different columns in the cell array. One or more source lines SL may be arranged in different columns in the cell array. A plurality of auxiliary lines AL may be arranged in different columns in the cell array.

Each of the bit lines BL may be connected to an end of auxiliary transistors $T_A$ in the same row, for example, drain regions (145 of FIG. 2). Word lines WL may individually be connected to a control gate CG of memory transistors $T_M$ in the same column or control gate electrodes (135 of FIG. 2). Source lines SL may be individually connected to an end of memory transistors $T_M$ in the same column, for example, source regions (140 of FIG. 2) in the same column. Source lines SL may be connected to each other and/or grounded. Auxiliary lines AL may be individually connected to gates AG of auxiliary transistors $T_A$ in the same column and/or auxiliary gate electrodes (115 of FIG. 2).

The example embodiment non-volatile memory device in FIG. 7 may have any number of bit, word, source, and/or auxiliary lines BL, WL, SL, or AL. Those features shown in FIG. 7 are merely for illustration and the disclosure is not limited thereto.

Figure 8:
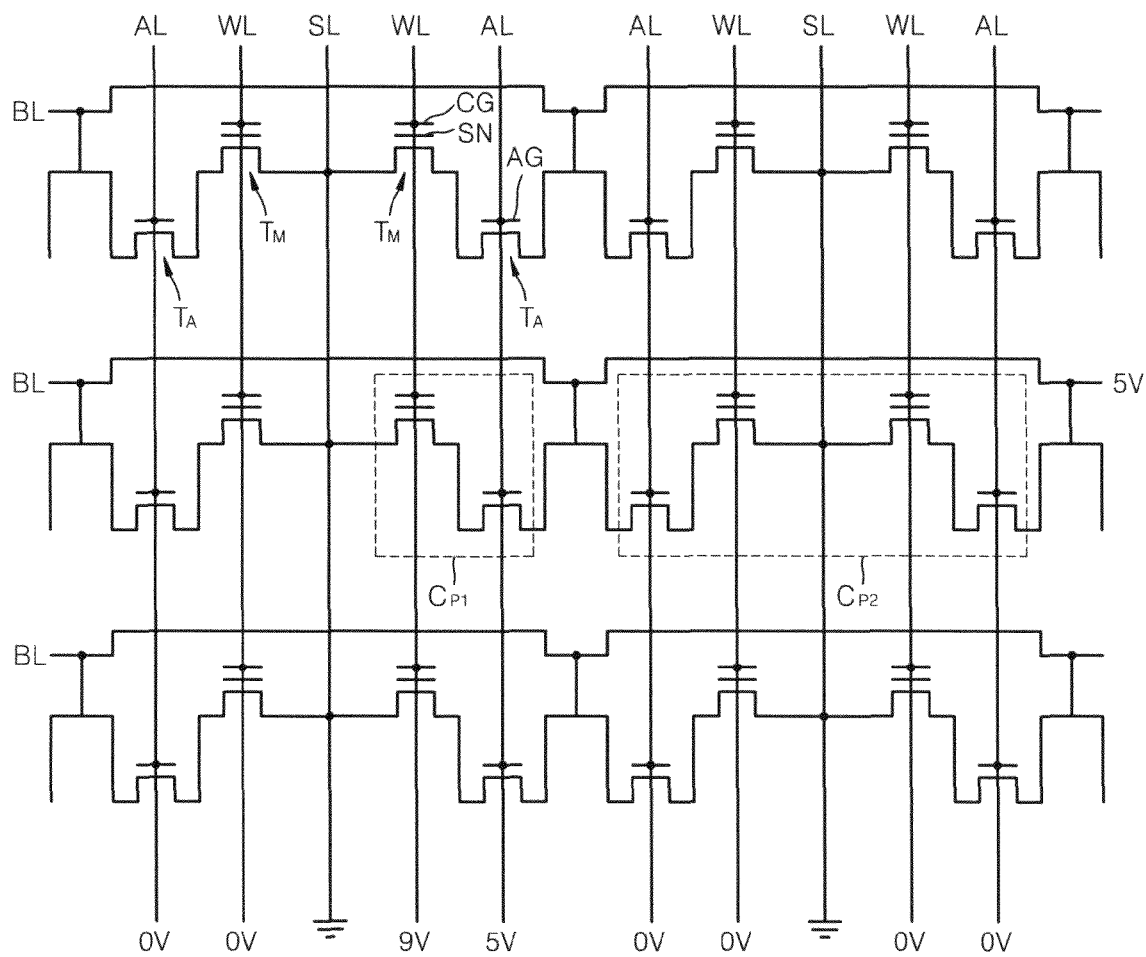
FIG. 8 is a circuit diagram illustrating an example program operation of the example embodiment non-volatile memory device of FIG. 7.
Figure 9:
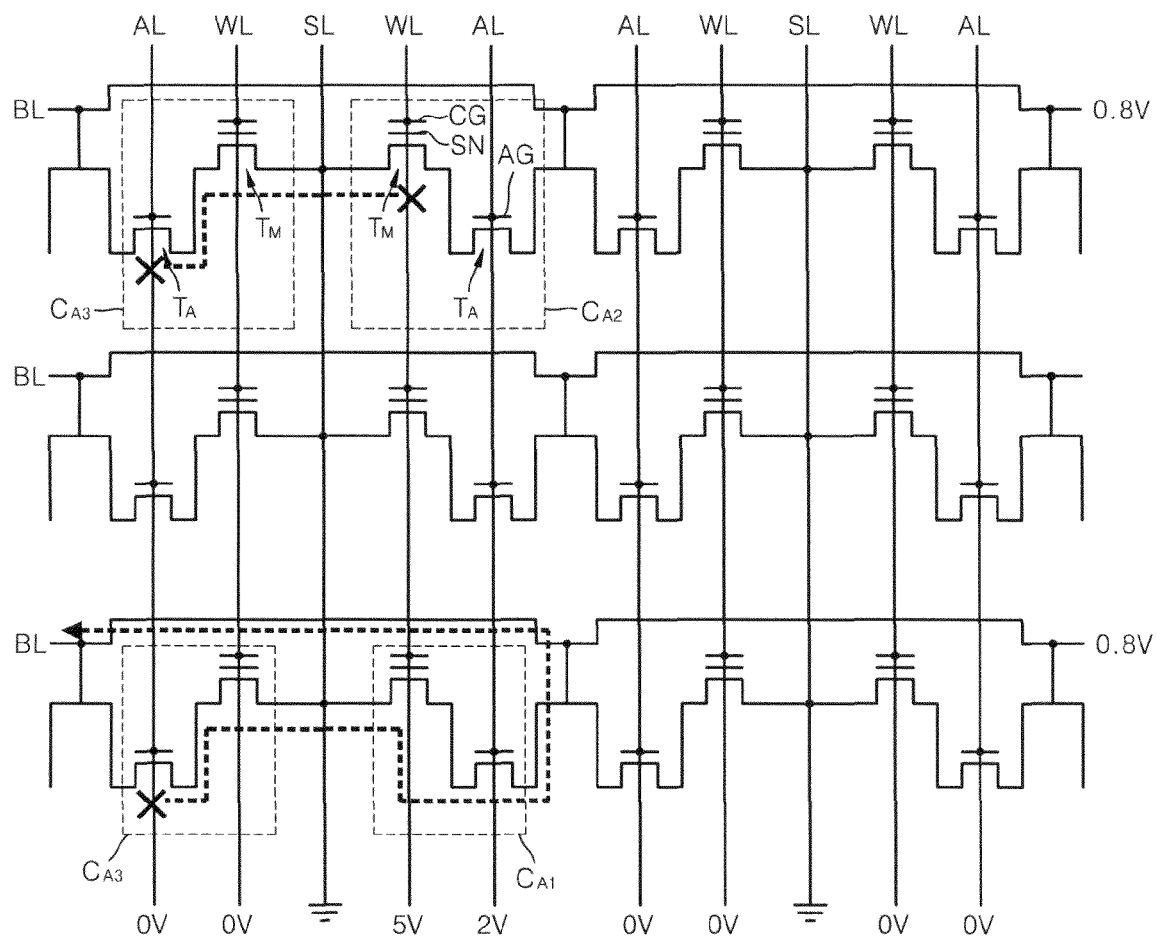
FIG. 9 is a circuit diagram illustrating an example embodiment read operation of the example embodiment non-volatile memory device of FIG. 7.

FIG. 8 is a circuit diagram illustrating a program operation of an example embodiment non-volatile memory device of FIG. 7. FIG. 9 is a circuit diagram illustrating a read operation of an example embodiment non-volatile memory device of FIG. 7.

As shown in FIG. 8, data may be programmed into the memory transistor $T_M$ by selecting one or more unit cells $C_{P1}$. For example, data programming may be performed in such a manner that electrons may be stored in a storage node SN of the memory transistor $T_M$ and/or a charge storing layer (125 of FIG. 2). Data may be previously programmed into memory transistors $T_M$ in a pair of unit cells $C_{P2}$ sharing a bit line BL with a unit cell $C_{P1}$.

For example, an operating voltage, for example, about 5V, may be applied to a bit line BL connected to the selected unit cell $C_{P1}$. A program voltage, for example, about 9V, may be applied to a word line WL connected to the selected unit cell $C_{P1}$, and a voltage of about 0V may be applied to the other word lines WL. A turn-on voltage, for example, about 5V, may be applied to an auxiliary line AL connected to the selected unit cell $C_{P1}$, and/or a voltage of about 0V may be applied to the other auxiliary lines AL.

All memory and auxiliary transistors $T_M$ and $T_A$ in the selected unit cell $C_{P1}$ may be turned on, and a program operation may be performed. All auxiliary transistors $T_A$ in the previously programmed unit cells $C_{P2}$ may be turned off. Thus, drain disturbance, in which data programmed into the unit cells $C_{P2}$ moves through the bit line BL, may be prevented or reduced and reliability of a program operation may be enhanced.

As shown in FIG. 9, the state of data programmed into memory transistors $T_M$ may be read by selecting one or more unit cells $C_{A1}$ and $C_{A2}$. For example, a read operation may be performed in such a manner that a current may be measured through a bit line BL connected to the memory transistors $T_M$ in the unit cells $C_{A1}$ and $C_{A2}$. Threshold voltages of the unit cells $C_{A1}$ and $C_{A2}$ may be about 1.0 and about 7.5V, respectively. Threshold voltages of another unit cell $C_{A3}$ adjacent to the unit cells $C_{A1}$ and $C_{A2}$ may be about negative 0.5V. Unit cell $C_{A1}$ may be in an erase state, unit cell $C_{A2}$ may be in a program state, and/or unit cell $C_{A3}$ may be in an over-erase state.

For example, a first read voltage, for example, about 0.8V, may be applied to the bit lines BL. A second read voltage, for example, about 5V, may be applied to a word line WL connected to the selected unit cell $C_{A1}$, and/or a voltage of about 0V may be applied to the other word lines WL. A turn-on voltage, for example, a voltage of about 2V, may be applied to an auxiliary line AL connected to the selected unit cell $C_{A1}$, and/or a voltage of about 0V may be applied to other auxiliary lines AL.

All memory and auxiliary transistors $T_M$ and $T_A$ in the unit cell $C_{A1}$ being in an erase state may be turned on, and thus electrons may flow from a source line SL to the bit line BL (indicated by the arrow). The auxiliary transistor $T_A$ in the unit cell $C_{A2}$ being in the program state may be turned on, while the memory transistor $T_M$ in the unit cell $C_{A2}$ may be turned off (indicated by "×"). The memory transistor $T_M$ in the unit cell $C_{A3}$ being in the over-erase state may be turned on, while the auxiliary transistor $T_A$ in the unit cell $C_{A3}$ may be turned off (indicated by "×"). Unit cell $C_{A3}$ being in the over-erase state, unit cell $C_{A1}$ may be read as an on-cell, and/or unit cell $C_{A2}$ may be read as an off-cell.

This reading may be possible because the auxiliary transistor $T_A$ may be turned off, so that a current flowing through the bit line BL from the unit cell $C_{A3}$ being in the over-erase state may be reduced or prevented. A problem recognized by the inventors is that an off-cell may not be read in related art, but example embodiments may increase the reliability of a read operation.

A voltage may be applied to a semiconductor substrate (105 of FIG. 2) regardless of an auxiliary transistor $T_A$, so that an erase operation for example embodiment non-volatile memory devices may be performed.

Example embodiment non-volatile memory devices may provide a source and/or drain region between a recess-type auxiliary transistor and a planar-type memory transistor may be omitted. Lengths of gates of the memory and auxiliary transistors may be reduced while reducing or preventing punch-through. Integration of example embodiment non-volatile memory devices may be increased while maintaining the reliability thereof.

Example embodiment non-volatile memory devices having a NOR structure may solve the newly recognized problem of drain disturbance and off-cell read impossibility in the related art.

While example embodiments have been particularly shown and described with reference to the attached figures, it will be understood by those of ordinary skill in the art that various changes in form and details may be made therein without departing from the spirit and scope of the following claims.

What is claimed is:

1. A non-volatile memory device, comprising:
    a semiconductor substrate including a source region and a first drain region;
    a first control gate electrode on the substrate, the source region being defined in the substrate at a first side of the first control gate electrode;
    a first charge storing layer between the semiconductor substrate and the first control gate electrode;
    a first auxiliary gate electrode recessed into the substrate, the first auxiliary gate electrode being between the first drain region and the first control gate electrode at a second side of the first control gate electrode, the first control gate electrode and the first auxiliary gate electrode having a longest dimension extending in a same direction; and
    a bit line connected to the first drain region.

2. The non-volatile memory device of claim 1, wherein a bottom surface of the first charge storing layer is higher than a top surface of the first auxiliary gate electrode.

3. The non-volatile memory device of claim 1, wherein the substrate further includes,
    a first channel region defined near a surface of the substrate under the first control gate electrode, and
    a second channel region defined near a surface of the substrate surrounding the first auxiliary gate electrode, the first and the second channel regions being electrically connected to each other.

4. The non-volatile memory device of claim 1, further comprising:
    a first tunneling insulating layer between the semiconductor substrate and the first charge storing layer; and
    a first blocking insulating layer between the first charge storing layer and the first control gate electrode.

5. The non-volatile memory device of claim 1, further comprising:
    a first gate insulating layer between the semiconductor substrate and the first auxiliary gate electrode.

6. The non-volatile memory device of claim 1, wherein the source region is configured to operate as a source line and is grounded.

7. The non-volatile memory device of claim 1, further comprising:
    a second control gate electrode on the substrate, the second control gate electrode at a side of the source region opposite the first control gate electrode; and
    a second charge storing layer between the substrate and the second control gate electrode.

8. The non-volatile memory device of claim 7, further comprising:
    a second auxiliary gate electrode recessed into the substrate at a first side of the second control gate electrode opposite to the source region, wherein the substrate further includes a second drain region defined at first side of the second auxiliary gate electrode being opposite to the second control gate electrode.

9. The non-volatile memory device of claim 8, wherein the bit line is connected to the second drain region.

10. The non-volatile memory device of claim 8, wherein a bottom surface of the second charge storing layer is higher than a top surface of the second auxiliary gate electrode.

11. The non-volatile memory device of claim 8, further comprising:
    a first channel region defined near a surface of the substrate under the second control gate electrode; and
    a second channel region defined near a surface of the substrate surrounding the second auxiliary gate electrode, the first and second channel regions being electrically connected to each other.

12. The non-volatile memory device of claim 8, further comprising:
    a second tunneling insulating layer between the substrate and the second charge storing layer; and
    a second blocking insulating layer between the second charge storing layer and the second control gate electrode.

13. The non-volatile memory device of claim 8, further comprising:
    a second gate insulating layer between the substrate and the second auxiliary gate electrode.

14. A non-volatile memory device, comprising:
    a plurality of unit cells, each of the unit cells including at least one memory transistor and at least one auxiliary transistor, the at least one memory transistor and the at least one auxiliary transistor being connected in series and arrayed in a matrix,
    the memory transistor including,
        a semiconductor substrate including a source region and a first drain region,
        a first control gate electrode on the substrate, the source region being defined in the substrate at a first side of the first control gate electrode, and
        a first charge storing layer between the semiconductor substrate and the first control gate electrode,
    the auxiliary transistor including,
        a first auxiliary gate electrode recessed into the substrate, the first auxiliary gate electrode being between the first drain region and the first control gate electrode at a second side of the first control gate electrode, the first control gate electrode and the first auxiliary gate electrode having a longest dimension extending in a same direction;
    a plurality of bit lines, each of the bit lines being in a separate row passing through the unit cells such that each bit line is connected to each drain region of each of the plurality of memory transistors in the row; and
    a plurality of word lines, each of the word lines being in a separate column passing through the unit cells such that each word line is connected to each control gate electrode of each of the plurality of memory transistors in the column.

15. The non-volatile memory device of claim 14, wherein the source region in a pair of unit cells is shared, the pair of unit cells being two adjacent unit cells of the plurality of unit cells connected to a same bit line in a same row.

16. The non-volatile memory device of claim 14, further comprising:
   a plurality of source lines, each of the source lines being in a separate column passing through the unit cells and electrically connecting each source region of each of the plurality of memory transistors in the column.

17. The non-volatile memory device of claim 16, wherein the plurality of source lines are grounded.

18. The non-volatile memory device of claim 14, further comprising:
   a plurality of auxiliary lines, each of the auxiliary lines being in a separate column passing through the unit cells and electrically connecting each auxiliary gate electrode of the plurality of auxiliary transistors arranged in the column.

19. The non-volatile memory device of claim 14, wherein a bottom surface of the charge storing layer is higher than a top surface of the auxiliary gate electrode.

20. The non-volatile memory device of claim 14, wherein the substrate further includes,
   a first channel region defined near a surface of the substrate under the first control gate electrode, and
   a second channel region defined near a surface of the substrate surrounding the first auxiliary gate electrode, the first and the second channel regions being electrically connected to each other.

21. A method of operating a non-volatile memory device, the method comprising:
   selecting one or more of a plurality of unit cells to store data into the unit cells, each of the unit cells including at least one memory transistor and at least one auxiliary transistor, the at least one memory transistor and the at least one auxiliary transistor being connected in series and arrayed in a matrix,
   the memory transistor including,
      a semiconductor substrate including a source region and a first drain region,
      a first control gate electrode on the substrate, the source region being defined in the substrate at a first side of the first control gate electrode, and
      a first charge storing layer between the semiconductor substrate and the first control gate electrode,
   the auxiliary transistor including,
      a first auxiliary gate electrode recessed into the substrate, the first auxiliary gate electrode being between the first drain region and the first control gate electrode at a second side of the first control gate electrode, the first control gate electrode and the first auxiliary gate electrode having a longest dimension extending in a same direction;
   storing data in the selected one or more unit cells, wherein the at least one auxiliary transistor in the other unit cells except the selected one or more unit cells are turned off in the storing.

22. The method of claim 21, further comprising:
   selecting one or more of the plurality of unit cells to read data states of the unit cells, wherein the auxiliary transistors in each the plurality of unit cells except the selected one or more unit cells are turned off in the read operation.

* * * * *